United States Patent
Navarro Goldaraz et al.

(10) Patent No.: US 12,224,149 B2
(45) Date of Patent: *Feb. 11, 2025

(54) ION SOURCE FOR CONTROLLING DECOMPOSITION BUILDUP USING CHLORINE CO-GAS

(71) Applicant: Applied Materials, Inc., Santa Clara, CA (US)

(72) Inventors: Mateo Navarro Goldaraz, Cambridge, MA (US); Graham Wright, Newburyport, MA (US); Ori Noked, Brookline, MA (US)

(73) Assignee: Applied Materials, Inc., Santa Clara, CA (US)

( * ) Notice: Subject to any disclaimer, the term of this patent is extended or adjusted under 35 U.S.C. 154(b) by 187 days.

This patent is subject to a terminal disclaimer.

(21) Appl. No.: 18/099,353

(22) Filed: Jan. 20, 2023

(65) Prior Publication Data

US 2024/0249904 A1 Jul. 25, 2024

(51) Int. Cl.
*H01J 27/02* (2006.01)
*H01J 27/26* (2006.01)

(52) U.S. Cl.
CPC ............ *H01J 27/022* (2013.01); *H01J 27/26* (2013.01)

(58) Field of Classification Search
CPC .. H01J 37/3244; H01J 37/08; H01J 37/32055; H01J 2237/08; H01J 27/022; H01J 37/3426; C23C 16/4481
See application file for complete search history.

(56) References Cited

U.S. PATENT DOCUMENTS

| | | |
|---|---|---|
| 2008/0142702 A1 | 6/2008 | Frosien et al. |
| 2010/0154835 A1 | 6/2010 | Dimeo et al. |
| 2014/0357069 A1 | 12/2014 | Sinha et al. |
| 2019/0180971 A1 | 6/2019 | Becker et al. |
| 2021/0020403 A1 | 1/2021 | Murooka |
| 2022/0139664 A1 | 5/2022 | Colvin et al. |

FOREIGN PATENT DOCUMENTS

| | | |
|---|---|---|
| JP | 2019-139943 A | 8/2019 |
| TW | 201937521 A | 9/2019 |
| TW | 202105456 A | 2/2021 |
| WO | 2014/137872 A1 | 9/2014 |
| WO | 2022/094381 A1 | 5/2022 |

OTHER PUBLICATIONS

International Search Report and Written Opinion mailed Apr. 1, 2024 in corresponding PCT application No. PCT/US2023/083829.

*Primary Examiner* — Monica C King
(74) *Attorney, Agent, or Firm* — Nields, Lemack & Frame, LLC

(57) ABSTRACT

An ion source for generating an ion beam containing aluminum ions is disclosed. The ion source includes a first gas source to introduce an organoaluminium compound into the arc chamber of the ion source. A second gas, different from the first gas, which is a chlorine-containing gas is also introduced to the arc chamber. The chloride co-flow reduces the buildup of decomposition material that occurs within the arc chamber. This buildup may occur at the gas bushing, the extraction aperture or near the repeller. In some embodiments, the second gas is introduced continuously. In other embodiments, the second gas is periodically introduced, based on hours of operation or the measured uniformity of the extracted ion beam. The second gas may be introduced from second gas source or from a vaporizer.

20 Claims, 2 Drawing Sheets

ION SOURCE FOR CONTROLLING DECOMPOSITION BUILDUP USING CHLORINE CO-GAS

FIELD

Embodiments of the present disclosure relate to an ion source and more particularly, an ion source for generating aluminum ions that controls decomposition buildup caused by the use of DMAC.

BACKGROUND

Various types of ion sources may be used to create the ions that are used in semiconductor processing equipment. For example, an indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller may be disposed on the end of the arc chamber opposite the cathode. The cathode and repeller may be biased so as to repel the electrons, directing them back toward the center of the arc chamber. In some embodiments, a magnetic field is used to further confine the electrons within the arc chamber. A plurality of sides is used to connect the two ends of the arc chamber.

An extraction aperture is disposed along one of these sides, proximate the center of the arc chamber, through which the ions created in the arc chamber may be extracted.

In certain embodiments, it may be desirable to extract an ion beam that is made up of aluminum ions. Some gasses that are useful in creating an ion beam of aluminum ions are dimethylaluminum chloride (DMAC; $(CH_3)_2AlCl$) and trimethylaluminum (TMA; $(CH_3)_3Al$).

However, prolonged use of DMAC in an ion source chamber may result in the buildup of decomposition material, such as aluminum carbide. This buildup may form as whiskers in the extraction aperture, on the gas bushings, or on the repeller. Whiskers in the extraction aperture lead to a nonuniform ion beam. Buildup around the gas bushing reduces or prevents the flow of gas into the ion source. Buildup on the repeller leads to shorting of this component.

Therefore, an ion source that is capable of operating using DMAC, TMA or other aluminum-containing gasses while preventing or controlling the buildup of decomposition material would be beneficial. Additionally, it would be advantageous if the ion source could operate continuously without needing a dedicated cleaning process.

SUMMARY

An ion source for generating an ion beam containing aluminum ions is disclosed. The ion source includes a first gas source to introduce an organoaluminium compound into the arc chamber of the ion source. A second gas, different from the first gas, which is a chlorine-containing gas, is also introduced to the arc chamber. The chloride co-flow reduces the buildup of decomposition material that occurs within the arc chamber. This buildup may occur at the gas bushing, the extraction aperture or near the repeller. In some embodiments, the second gas is introduced continuously. In other embodiments, the second gas is periodically introduced, based on hours of operation or the measured uniformity of the extracted ion beam. The second gas may be introduced from a second gas source or from a vaporizer.

According to one embodiment, an indirectly heated cathode ion source is disclosed. The indirectly heated cathode ion source comprises an arc chamber, comprising a plurality of walls; an indirectly heated cathode disposed in the arc chamber; a first valve in communication with the arc chamber and a first gas source, wherein the first gas source comprises a first gas that is an organoaluminium compound; a second valve in communication with the arc chamber and a second gas source, wherein the second gas source comprises a second gas, different from the first gas and that is a chlorine containing gas; and a controller in communication with the first valve and the second valve so as to limit a buildup of molecular byproducts created by decomposition of the first gas. In some embodiments, the first gas is dimethylaluminum chloride (DMAC) or trimethylaluminum (TMA). In some embodiments, the second gas is chlorine gas. In some embodiments, the controller controls the second valve so as introduce the second gas whenever the first gas is flowing in the arc chamber. In certain embodiments, the controller controls the first valve and the second valve so that a flow rate of the second gas is between 30 and 70% of the flow rate of the first gas. In some embodiments, the controller controls the second valve so as introduce the second gas periodically. In certain embodiments, the controller controls the second valve based on a number of hours of operation of the indirectly heated cathode ion source. In certain embodiments, a beam profiler is used to measure a uniformity of an ion beam extracted from the arc chamber and the controller controls the second valve based on the uniformity of the ion beam extracted from the arc chamber.

According to another embodiment, an indirectly heated cathode ion source is disclosed. The indirectly heated cathode ion source comprises an arc chamber, comprising a plurality of walls; an indirectly heated cathode disposed in the arc chamber; a first valve in communication with the arc chamber and a first gas source, wherein the first gas source contains a first gas that is an organoaluminium compound; a vaporizer in communication with the arc chamber; a heater to heat dopant material disposed within the vaporizer to form a second gas; and a controller in communication with the first valve and the heater so as to limit a buildup of molecular byproducts created by decomposition of the first gas. In some embodiments, the first gas is dimethylaluminum chloride (DMAC) or trimethylaluminum (TMA). In some embodiments, the dopant material is indium chloride, aluminum chloride or another chloride-containing solid. In some embodiments, the controller controls the heater so as introduce the second gas from the vaporizer whenever the first gas is flowing in the arc chamber. In certain embodiments, the controller controls the first valve and the heater so that a flow rate of the second gas is between 10 and 70% of the flow rate of the first gas. In some embodiments, the controller controls the heater so as introduce the second gas periodically. In certain embodiments, the controller controls the heater based on a number of hours of operation of the indirectly heated cathode ion source. In certain embodiments, a beam profiler is used to measure a uniformity of an ion beam extracted from the arc chamber and the controller controls the heater based on the uniformity of the ion beam extracted from the arc chamber.

According to another embodiment, a method of operating an indirectly heated cathode ion source, adapted to generate aluminum ions is disclosed. The method comprises introducing a first gas into an arc chamber of the indirectly heated cathode ion source, wherein the first gas comprises an organoaluminium compound; ionizing the first gas and extracting an ion beam containing aluminum ions from the arc chamber; and introducing a second gas to the arc chamber, wherein the second gas is different from the first gas and comprises chlorine; wherein introduction of the second gas prolongs operation of the indirectly heated cathode ion source. In some embodiments, the second gas is introduced periodically. In certain embodiments, the second gas is introduced based on a number of hours of operation of the indirectly heated cathode ion source. In certain embodiments, a uniformity of the extracted ion beam is monitored, and the second gas is introduced when the uniformity is not within a predetermined threshold.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
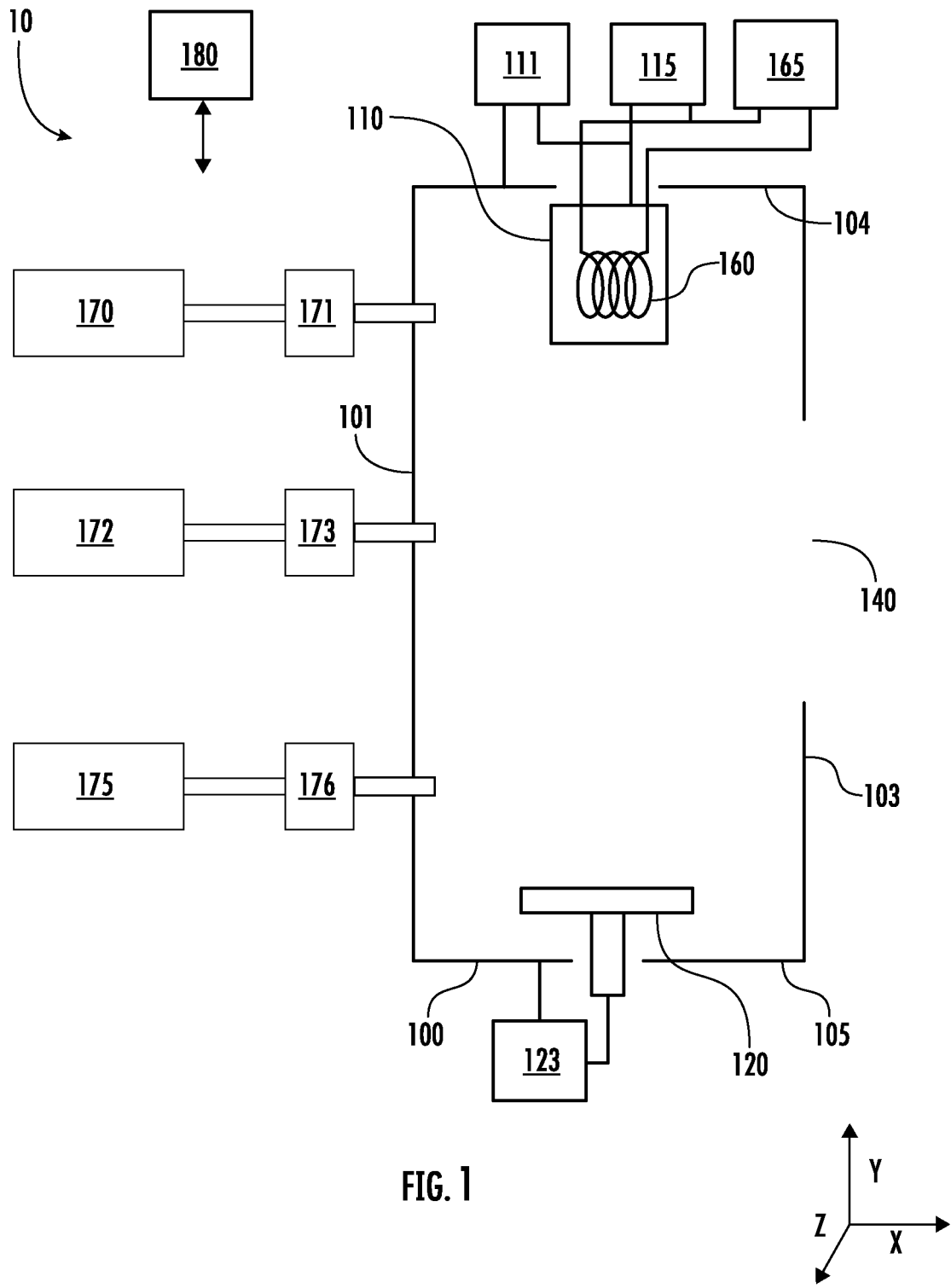
FIG. 1 is an indirectly heated cathode (IHC) ion source in accordance with one embodiment.

FIG. 1 shows a first embodiment of an IHC ion source 10 that overcomes the issues associated with prolonged use of DMAC or TMA. The IHC ion source 10 includes an arc chamber 100, comprising two opposite ends, and walls 101 connecting to these ends. The walls 101 of the arc chamber 100 may be constructed of an electrically conductive material and may be in electrical communication with one another. In some embodiments, a liner may be disposed proximate one or more of the walls 101. A cathode 110 is disposed in the arc chamber 100 at a first end 104 of the arc chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of the cathode 110. The cathode bias power supply 115 may bias the filament 160 so that it has a voltage that is between, for example, 200V to 1500V more negative than the voltage of the cathode 110. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. In certain embodiments, the cathode 110 may be biased relative to the arc chamber 100, such as by bias power supply 111. In other embodiments, the cathode 110 may be electrically connected to the arc chamber 100, so as to be at the same voltage as the walls 101 of the arc chamber 100. In these embodiments, bias power supply 111 may not be employed and the cathode 110 may be electrically connected to the walls 101 of the arc chamber 100. In certain embodiments, the arc chamber 100 is connected to electrical ground.

On the second end 105, which is opposite the first end 104, a repeller 120 may be disposed. The repeller 120 may be biased relative to the arc chamber 100 by means of a repeller bias power supply 123. In other embodiments, the repeller 120 may be electrically connected to the arc chamber 100, so as to be at the same voltage as the walls 101 of the arc chamber 100. In these embodiments, repeller bias power supply 123 may not be employed and the repeller 120 may be electrically connected to the walls 101 of the arc chamber 100. In still other embodiments, a repeller 120 is not employed.

The cathode 110 and the repeller 120 are each made of an electrically conductive material, such as a metal or graphite.

In certain embodiments, a magnetic field is generated in the arc chamber 100. This magnetic field is intended to confine the electrons along one direction. The magnetic field typically runs parallel to the walls 101 from the first end 104 to the second end 105. For example, electrons may be confined in a column that is parallel to the direction from the cathode 110 to the repeller 120 (i.e., the y direction). Thus, electrons do not experience any electromagnetic force to move in the y direction. However, movement of the electrons in other directions may experience an electromagnetic force.

Disposed on one side of the arc chamber 100, referred to as the extraction plate 103, may be an extraction aperture 140. In FIG. 1, the extraction aperture 140 is disposed on a side that is parallel to the Y-Z plane (perpendicular to the page).

Further, the IHC ion source 10 may be in communication with at least two gas sources. The first gas source 170 may contain a first gas that is an organoaluminium compound, which is a compound in which an aluminum atom is bonded with a carbon atom, such as dimethylaluminum chloride (DMAC; $(CH_3)_2AlCl$) or trimethylaluminum (TMA; $(CH_3)_3Al$). A first valve 171 may be utilized to control the flow of the first gas from the first gas source 170 to the arc chamber 100. The second gas source 172 may contain a second gas that is a chlorine containing gas, such as $Cl_2$ or HCl. The second gas does not contain carbon and is different from the first gas. A second valve 173 may be utilized to control the flow of the second gas from the second gas source 172 to the arc chamber 100. The third gas source 175 may be present and may include various diluent gasses, such as hydrogen, argon or other gasses. A third valve 176 may be utilized to control the flow of the diluent gasses from the third gas source 175 to the arc chamber 100. The first valve 171, the second valve 173 and the third valve 176 may be mass flow controllers (MFC) such that the flow rate of each gas may be controlled. Gas bushings may be used to connect the outputs from the valves to the arc chamber 100.

A controller 180 may be in communication with one or more of the power supplies such that the voltage or current supplied by these power supplies may be modified. The controller 180 may also be in communication with the first valve 171, the second valve 173 and the third valve 176. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

In the embodiment shown in FIG. 1, the controller 180 is configured to allow the IHC ion source 10 to generate an ion beam that includes aluminum ions, while minimizing buildup of decomposition material within the arc chamber 100.

Figure 2:
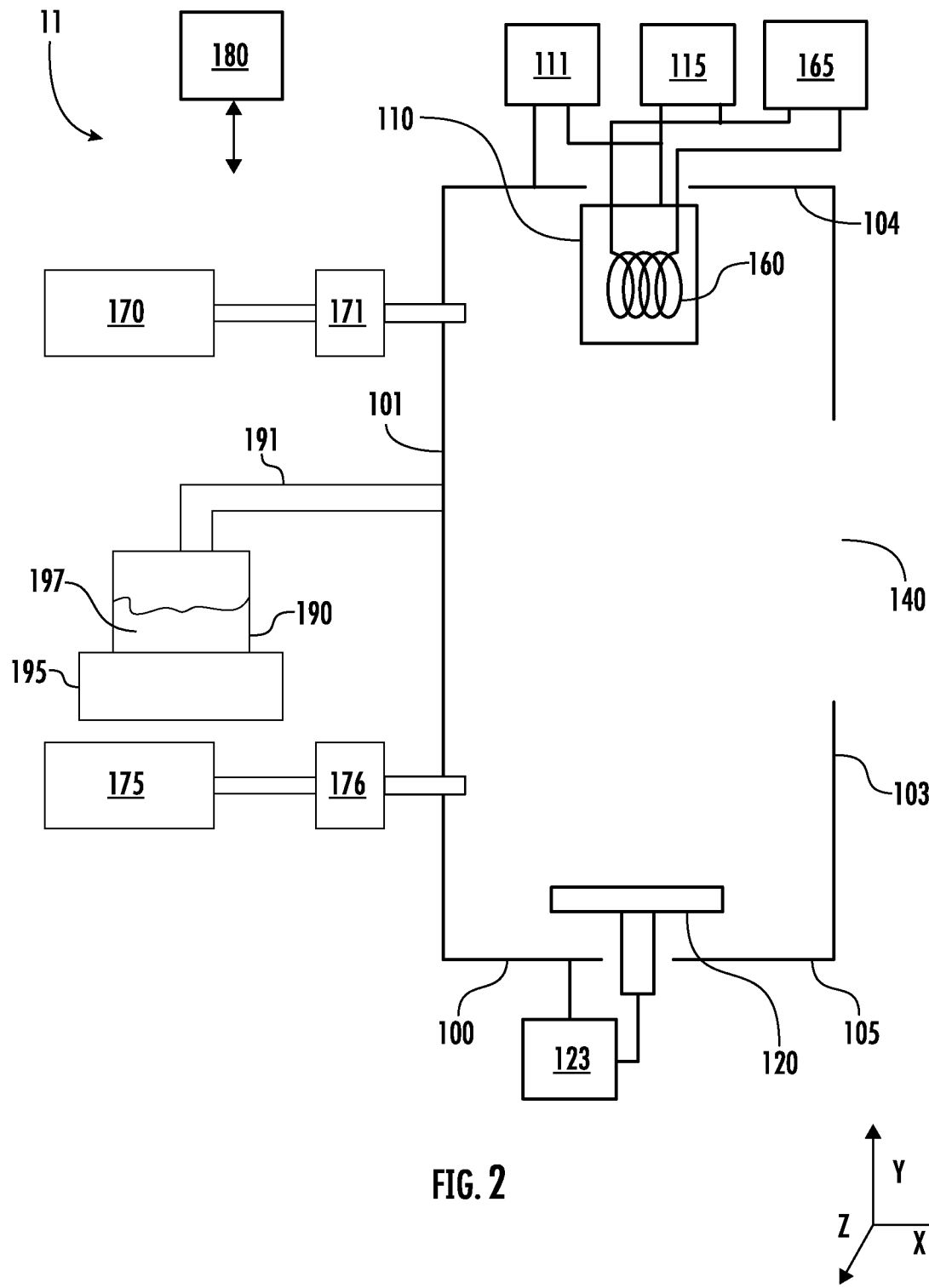
FIG. 2 is an indirectly heated cathode (IHC) ion source in accordance with a second embodiment.

FIG. 2 shows a second embodiment of an IHC ion source 11 that may be used to minimize or reduce the buildup of decomposition material. In this embodiment, the second gas source 172 and the second valve 173 may be removed. The other components are as described above. In this embodiment, a vaporizer 190 may be in communication with the arc chamber 100. For example, the vaporizer may be disposed outside the arc chamber 100, but may include a conduit 191 connecting the output of the vaporizer with the arc chamber 100. A heater 195 may be disposed proximate the vaporizer 190 to heat and vaporize the dopant material 197 disposed within the vaporizer 190. The heater 195 may be a resistive heater or another type. The design of the heater is implementation specific and not limited by this disclosure. In certain embodiments, the dopant material 197 within the vaporizer 190 may be a solid compound that contains chlorine. For example, the dopant material 197 may be aluminum chloride, indium chloride or another chloride-containing solid. Because the first gas contains carbon, and the carbon forms the decomposition material, the dopant material 197 does not contain carbon. When the heater 195 is actuated, the vaporizer 190 produces a chlorine containing gas.

In this embodiment, the controller 180 may be in communication with one or more of the power supplies such that the voltage or current supplied by these power supplies may be modified. The controller 180 may also be in communication with the first valve 171, the third valve 176 and the heater 195.

In operation, to create an ion beam, the controller 180 may enable the flow of the first gas into the arc chamber 100. Additionally, the controller may provide a current to the filament 160, provide a cathode bias voltage using cathode bias power supply 115 and provide a bias voltage using bias power supply 111. The thermionic electrons ionize the first gas, creating a plasma. An electrode, disposed outside the arc chamber 100 is then used to extract the positive aluminum ions from the arc chamber 100.

However, as noted above, in certain embodiments, ions within the plasma may combine and produce other molecular byproducts, referred to as decomposition materials, such as aluminum carbide. Specifically, as the DMAC is ionized, the carbon and aluminum ions may recombine to form these molecular byproducts. Over time, this decomposition material may deposit inside the arc chamber 100, potentially building up on the gas bushings, the repeller 120 and/or the extraction aperture 140.

Another mechanism of decomposition is thermal decomposition, which entails the molecule breaking apart when it comes in contact with a surface above a thermal decomposition threshold temperature. Organometallic molecules, such as DMAC, are particularly susceptible to thermal decomposition. DMAC thermal decomposition threshold temperature is roughly 400° C. This thermal decomposition can also lead to carbon-rich deposition inside the arc chamber 100 of the ion source.

The introduction of excess chlorine in the arc chamber 100 may be beneficial in breaking up the depositions, or controlling the rate of deposition. The excess chlorine may combine with excess hydrogen from the first gas to form HCl. For example, the chloride may facilitate the following chemical reaction:

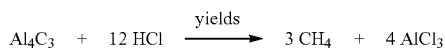

Methane ($CH_4$) is a gas that can be easily extracted from the arc chamber 100. Aluminum chloride ($AlCl_3$) can be ionized to create additional aluminum ions. Further, since $AlCl_3$ sublimates at low temperatures, both of these compounds remain in gas form at the temperatures used in the arc chamber 100. Thus, this reaction removes the buildup of decomposition material from with the arc chamber 100, and also may allow the creation of additional aluminum ions.

In certain embodiments, the controller 180 may allow the flow of the chloride containing gas (either from second gas source 172 in FIG. 1 or from the vaporizer 190 in FIG. 2) whenever the ion source is in use. Thus, the excess chlorine, which is always present, may prevent the buildup of decomposition material from occurring. In some embodiments, the flow rate of the chlorine containing gas may be related to the flow rate of the first gas. For example, when a second gas source 172 is used, the flow rate of the chlorine containing gas may be 30-70% of the flow rate of the first gas. If a vaporizer 190 is used, the flow rate of the chlorine containing gas may be 10-70% of the flow rate of the first gas. This may be due to the fact that there are other factors associated with a vaporizer species, such as the stoichiometry of the material being vaporized and the quantity of chlorine that is contained in the vaporized gas.

In other embodiments, the controller 180 may periodically allow the flow of the chloride containing gas to facilitate a cleaning process. In this embodiment, the controller 180 may enable the flow of the chlorine containing gas after a predetermined number of hours of operation to remove the buildup of decomposition material. For example, the controller 180 may enable the flow of the chlorine containing gas after 12-24 hours of operation. The chlorine containing gas may flow into the ion source for 1-2 hours to remove or reduce the buildup. While the chlorine containing gas is flowing into the arc chamber 100, the first gas may also be flowing, allowing aluminum ions to be generated and extracted from the arc chamber 100 during the cleaning process. After the buildup has been removed, the flow of chlorine containing gas may be terminated. The timer may then be reset and this sequence may repeat a plurality of times. In another embodiment, the controller 180 may use feedback from a sensor to determine when the chlorine containing gas is introduced into the arc chamber 100. For example, a beam profiler may be used to measure the uniformity of the extracted ion beam. If the uniformity is not within a predetermined threshold, such as within 18, the controller 180 may enable the flow of the chlorine containing gas to remove deposits inside the arc chamber 100 of the ion source and enable a more uniform beam to be extracted. The flow of the chlorine gas may be for a predetermined period of time, such as 1-2 hours, or may be related to the uniformity of the extracted ion beam.

The embodiments described above in the present application may have many advantages. As described above, prolonged use of DMAC results in the buildup of molecular byproducts within the ion source. In one test, after about 150 hours, flakes had formed on the extraction plate 103 near the extraction aperture 140. This causes a reduction in uniformity. Uniformity may be defined as the maximum deviation in beam current along the entire length of the beam width from the average beam current. In other words, a uniformity of 0% indicates that the beam current is the same along the entire length of the beam width. Further, after 250 hours of operation, the decomposition material had deposited on the gas bushings to such an extent that gas could no longer flow. Further, tests showed that the repeller 120 nearly shorted to the walls due to the excess buildup. By introducing excess chlorine to the arc chamber 100, these issues can be reduced or eliminated. One test demonstrated that the introduction of a chlorine containing gas showed that, after 285 hours of operation, the gas bushing was only ~50% blocked with decomposition material. This indicates that the addition of the chlorine-containing gas allows operation of ion source for more than 500 hours of operation before completely filling the gas bushing with decomposition material. Additionally, overall deposition and flaking in the ion source was significantly reduced with the addition of the chlorine-containing gas, allowing for beam uniformity to be maintained for longer periods of time.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An indirectly heated cathode ion source, comprising:
   an arc chamber, comprising a plurality of walls;
   an indirectly heated cathode disposed in the arc chamber;
   a first valve in communication with the arc chamber and a first gas source, wherein the first gas source comprises a first gas that is an organoaluminium compound;
   a second valve in communication with the arc chamber and a second gas source, wherein the second gas source comprises a second gas, different from the first gas and that is a chlorine containing gas; and
   a controller in communication with the first valve and the second valve so as to limit a buildup of molecular byproducts created by decomposition of the first gas.

2. The indirectly heated cathode ion source of claim 1, wherein the first gas is dimethylaluminum chloride (DMAC) or trimethylaluminum (TMA).

3. The indirectly heated cathode ion source of claim 1, wherein the second gas is chlorine gas.

4. The indirectly heated cathode ion source of claim 1, wherein the controller controls the second valve so as introduce the second gas whenever the first gas is flowing in the arc chamber.

5. The indirectly heated cathode ion source of claim 4, wherein the controller controls the first valve and the second valve so that a flow rate of the second gas is between 30 and 70% of the flow rate of the first gas.

6. The indirectly heated cathode ion source of claim 1, wherein the controller controls the second valve so as introduce the second gas periodically.

7. The indirectly heated cathode ion source of claim 6, wherein the controller controls the second valve based on a number of hours of operation of the indirectly heated cathode ion source.

8. The indirectly heated cathode ion source of claim 6, further comprising a beam profiler to measure a uniformity of an ion beam extracted from the arc chamber and wherein the controller controls the second valve based on the uniformity of the ion beam extracted from the arc chamber.

9. An indirectly heated cathode ion source, comprising:
   an arc chamber, comprising a plurality of walls;
   an indirectly heated cathode disposed in the arc chamber;
   a first valve in communication with the arc chamber and a first gas source, wherein the first gas source contains a first gas that is an organoaluminium compound;
   a vaporizer in communication with the arc chamber;
   a heater to heat dopant material disposed within the vaporizer to form a second gas; and
   a controller in communication with the first valve and the heater so as to limit a buildup of molecular byproducts created by decomposition of the first gas.

10. The indirectly heated cathode ion source of claim 9, wherein the first gas is dimethylaluminum chloride (DMAC) or trimethylaluminum (TMA).

11. The indirectly heated cathode ion source of claim 9, wherein the dopant material is indium chloride, aluminum chloride or another chloride-containing solid.

12. The indirectly heated cathode ion source of claim 9, wherein the controller controls the heater so as introduce the second gas from the vaporizer whenever the first gas is flowing in the arc chamber.

13. The indirectly heated cathode ion source of claim 12, wherein the controller controls the first valve and the heater so that a flow rate of the second gas is between 10 and 70% of the flow rate of the first gas.

14. The indirectly heated cathode ion source of claim 9, wherein the controller controls the heater so as introduce the second gas periodically.

15. The indirectly heated cathode ion source of claim 14, wherein the controller controls the heater based on a number of hours of operation of the indirectly heated cathode ion source.

16. The indirectly heated cathode ion source of claim 14, further comprising a beam profiler to measure a uniformity of an ion beam extracted from the arc chamber and wherein the controller controls the heater based on the uniformity of the ion beam extracted from the arc chamber.

17. A method of operating an indirectly heated cathode ion source, adapted to generate aluminum ions, comprising:
   introducing a first gas into an arc chamber of the indirectly heated cathode ion source, wherein the first gas comprises an organoaluminium compound;
   ionizing the first gas and extracting an ion beam containing aluminum ions from the arc chamber; and
   introducing a second gas to the arc chamber, wherein the second gas is different from the first gas and comprises chlorine; wherein introduction of the second gas prolongs operation of the indirectly heated cathode ion source.

18. The method of claim 17, wherein the second gas is introduced periodically.

19. The method of claim 18, wherein the second gas is introduced based on a number of hours of operation of the indirectly heated cathode ion source.

20. The method of claim 18, wherein a uniformity of the ion beam is monitored, and the second gas is introduced when the uniformity is not within a predetermined threshold.

* * * * *